United States Patent [19]

Mori et al.

[11] Patent Number: 5,679,590

[45] Date of Patent: Oct. 21, 1997

[54] METHOD FOR MANUFACTURING CONTACT HOLE FOR A NONVOLATILE SEMICONDUCTOR DEVICE

[75] Inventors: Seiichi Mori, Tokyo; Masaki Sato, Kawasaki; Kuniyoshi Yoshikawa, Tokyo, all of Japan

[73] Assignee: Kabushiki Kaisha Toshiba, Kawasaki, Japan

[21] Appl. No.: 623,882

[22] Filed: Mar. 29, 1996

Related U.S. Application Data

[62] Division of Ser. No. 18,364, Feb. 16, 1993, abandoned, which is a continuation of Ser. No. 668,336, Mar. 14, 1991, abandoned, which is a continuation of Ser. No. 445,941, Dec. 8, 1989, abandoned, which is a continuation of Ser. No. 162,587, Mar. 1, 1988, abandoned.

[30] Foreign Application Priority Data

| Mar. 4, 1987 | [JP] | Japan | 62-047731 |
| Sep. 3, 1987 | [JP] | Japan | 62-220675 |

[51] Int. Cl.⁶ .................................................. H01L 21/8247
[52] U.S. Cl. .............................. 437/43; 437/982; 437/984
[58] Field of Search .............................. 437/43, 240, 241, 437/978, 982, 984; 148/DIG. 20, DIG. 112, DIG. 114, DIG. 133

[56] References Cited

U.S. PATENT DOCUMENTS

| 4,162,176 | 7/1979 | Tsuda | 437/43 |
| 4,203,158 | 5/1980 | Frohman-Bentchkowsky et al. | 257/321 |
| 4,224,089 | 9/1980 | Nishimoto et al. | 437/982 |
| 4,271,582 | 6/1981 | Shirai et al. | 437/247 |
| 4,309,812 | 1/1982 | Horng et al. | 437/236 |
| 4,365,264 | 12/1982 | Mukai et al. | 257/759 |
| 4,376,947 | 3/1983 | Chiu et al. | 257/316 |
| 4,404,733 | 9/1983 | Sasaki et al. | 437/982 |
| 4,489,481 | 12/1984 | Jones | 437/982 |
| 4,641,420 | 2/1987 | Lee | 148/DIG. 20 |
| 4,656,732 | 4/1987 | Teng et al. | 437/193 |
| 4,763,177 | 8/1988 | Paterson | 257/315 |

FOREIGN PATENT DOCUMENTS

| 0 176 010 | 4/1986 | European Pat. Off. |
| 47-26975 | 10/1972 | Japan |
| 58-166766 | 10/1983 | Japan |
| 59-244274 | 8/1984 | Japan |
| 62-125679 | 6/1987 | Japan |

OTHER PUBLICATIONS

Mielke, "New EPROM Data–Loss Mechanisms," 21st Annual Proc. Reliability. Phys., pp. 106–113, 1983.

European Search Report No. EP 88 10 3309, dated May 18, 1989.

Schnable et al., "Passivation Coatings on Silicon Devices", Journal of the Electrochemical Society, vol. 22, No. 8, pp. 1092–1103.

West German Official Action No. DE 3133516A1 published Mar. 17, 1983.

"Nitride Sidewall Spacers Used as a Contamination Barrier", IBM Technical Disclosure Bulletin, vol. 30, Jan. 1988, pp. 295–296.

"New Methods of Processing Silicon Slices", T.C. Penn, Science, vol. 208 (May 1980), pp. 923–926.

*Primary Examiner*—Chandra Chaudhari
*Attorney, Agent, or Firm*—Finnegan, Henderson, Farabow, Garrett & Dunner, L.L.P.

[57] ABSTRACT

An $SiO_2$ film and a PSG film are stacked on a semiconductor substrate. A contact hole is formed through the both films. An $Si_3N_4$ film is formed on a side wall of the contact hole as a free ion $Na^+$ blocking film. An aluminum wiring layer is formed in the contact hole. This arrangement prevents free ions $Na^+$ from externally migrating through the $SiO_2$ film and reaching a nonvolatile semiconductor memory cell during and after the formation of the contact hole.

11 Claims, 4 Drawing Sheets

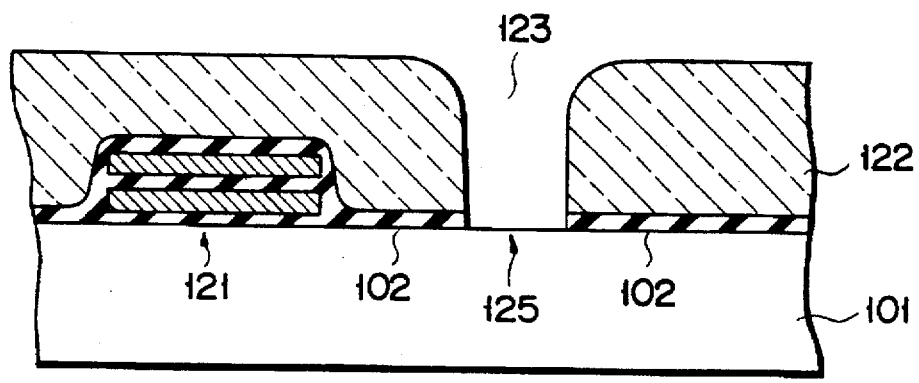
F I G. 3C
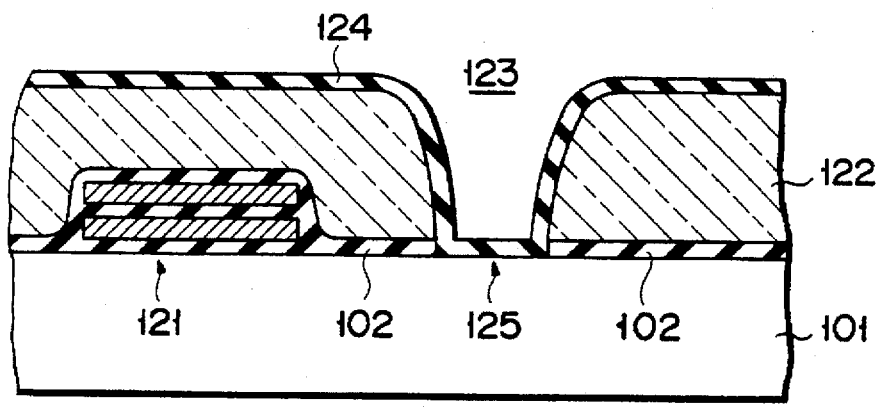
F I G. 3D
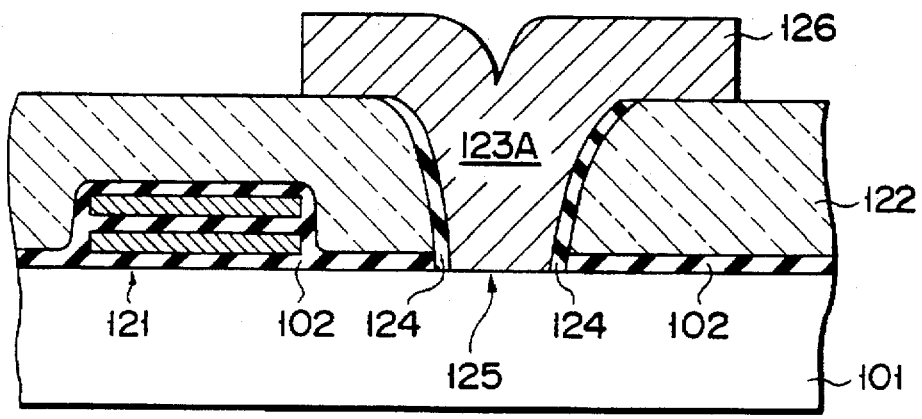
F I G. 3E 5,679,590

1

METHOD FOR MANUFACTURING CONTACT HOLE FOR A NONVOLATILE SEMICONDUCTOR DEVICE

This is a division of application Ser. No. 08/018,364 filed Feb. 16, 1993, which is a continuation of application Ser. No. 07/668,336 filed Mar. 14, 1991, which is a continuation of application Ser. No. 07/445,941 filed Dec. 8, 1989, which is a continuation of application Ser. No. 07/162,587 filed Mar. 1, 1988, all now abandoned.

BACKGROUND OF THE INVENTION

1. Field of the Invention

The present invention relates to a semiconductor device having a semiconductor memory and a method for manufacturing the same.

2. Description of the Related Art

As the speed and packing density of semiconductor devices are increased, increasing demands have recently arisen for improvements in reliability of semiconductor elements to be used, wirings to be connected to electrodes, and a coating structure for protecting the elements.

Especially, in non-volatile semiconductor devices such as EPROMs, degradation in reliability due to the migration of free ions such as $Na^+$, $Ca^+$, and $K^+$ has posed a serious problem. For example, if free ions such as $Na^+$ migrate into an EPROM cell, the electric charge stored in a floating gate is cancelled, resulting in inversion of stored information or decrease in data retention margin.

As shown in FIG. 1, in a conventional EPROM cell, phosphosilicate glass (PSG) film 12 is formed on Al wiring 11, and PSG film 13 is formed Al writing 11. Free ions $Na^+$ move relatively freely in an $SiO_2$ film used as, e.g., a gate insulating film. However, movement of these ions is restricted in a PSG film. Therefore, PSG films 12 and 13 serve to prevent the migration of free ions such as $Na^+$ from outside.

However once free ions $Na^+$ migrate into $SiO_2$ films, 14 and 15 under PSG film 13, they can freely move in the $SiO_2$ films. Therefore, these free ions are attracted to floating gate 16 by the Coulomb force of the accumulated negative electric charge in floating gate 16, thereby causing the destruction of stored information described above.

In order to prevent such degradation in reliability due to free ions, it is important to reduce the absolute amount of free ions contained in the $SiO_2$ films or prevent the external migration of free ions. In the conventional EPROM cell, however, insulating film 17 for covering floating gate 16 which serves as a fundamental element of a memory cell is made of $SiO_2$ film, and $SiO_2$ films 14 and 15 formed by thermal oxidation are present on diffusion layers 18 and 19 serving as source and drain regions. In this structure, free ions can easily migrate into the cell.

The inventors of the present invention analyzed the electric charge retention characteristic of EPROM cells and found a phenomenon in which stored electric charge is erroneously cancelled by the migration of free ions from a contact portion of a metal wiring. It was confirmed that such a phenomenon is mainly caused by the free ions taken into an exposed silicon oxide film in the contact portion especially during a manufacturing process of the metal wiring.

SUMMARY OF THE INVENTION

It is an object of the present invention to provide a semiconductor device which can prevent the migration of free ions from a contact hole and has high reliability, and a method for manufacturing the same. A semiconductor device according to the present invention comprises a semiconductor substrate; an insulating film formed on the semiconductor substrate; a contact hole formed in the insulating film; a free ion blocking layer formed on a side wall of the contact hole; and a wiring layer formed in the contact hole so as to be electrically connected to the semiconductor substrate at a bottom portion of the contact hole.

A method for manufacturing a semiconductor device according to the present invention, comprises the steps of forming an insulating film on an element formation region on a semiconductor substrate to prevent free ions from being taken into an insulating film in a contact portion during a manufacturing step of a metal wiring; forming a free ion getter film on the insulating film; forming a contact hole, in which the semiconductor substrate is exposed, by etching the getter and insulating films; forming a free ion blocking film on the entire surface of the resultant structure including a side wall of the contact hole; etching the free ion blocking film and leaving the free ion blocking film on the side wall of the contact hole; and forming a wiring in the contact hole.

According to the present invention, a wiring in a contact portion is completely isolated from an insulating film by a free ion blocking film. Therefore, the migration of free ions through the insulating film can be prevented in the step of forming the wiring, and hence a high-reliability semiconductor device can be manufactured.

BRIEF DESCRIPTION OF THE DRAWINGS

FIGS. 3A to 3E are sectional views showing a semiconductor device in each step for explaining a method for manufacturing the semiconductor device according to another embodiment of the present invention.

DETAILED DESCRIPTION OF THE PREFERRED EMBODIMENTS

A method for manufacturing an EPROM cell according to an embodiment of the present invention will be described below with reference to FIGS. 2A to 2G.

Figure 1:
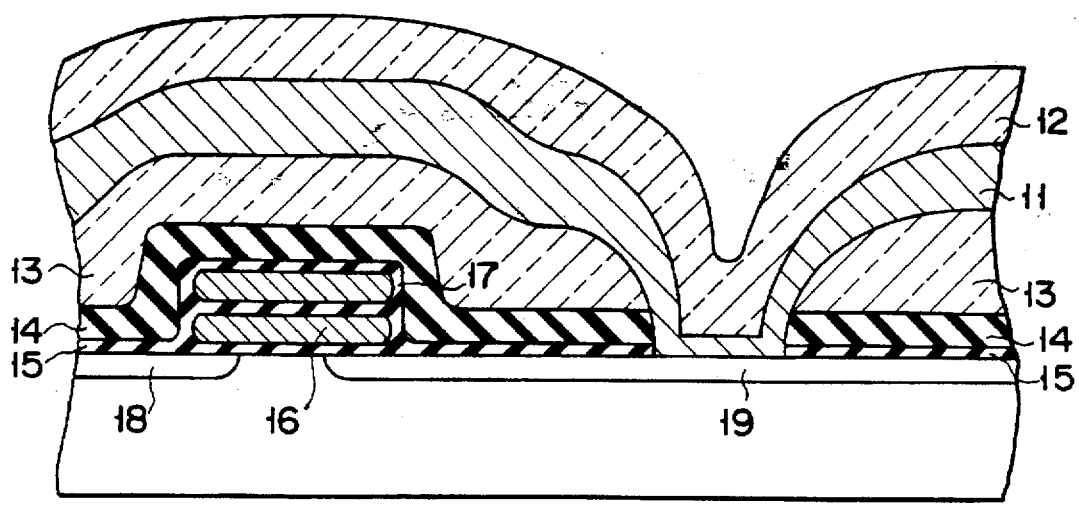
FIG. 1 is a sectional view for explaining a structure of a memory cell of a conventional EPROM.
Figure 2A:
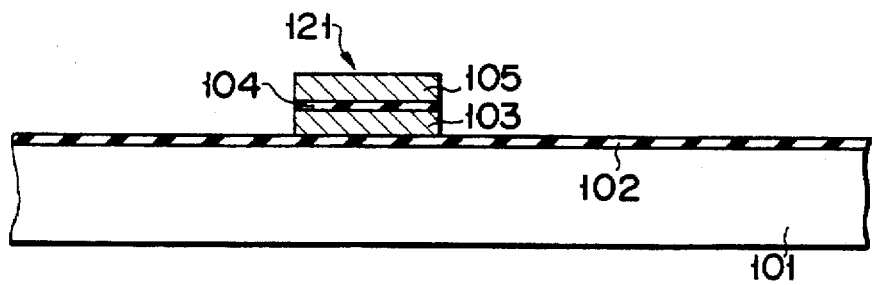
FIGS. 2A to 2G are sectional views showing a semiconductor device in each step for explaining a method for manufacturing the semiconductor device according to an embodiment of the present invention.

As shown in FIG. 2A, 250 Å-thick $SiO_2$ film 102 is formed in an element formation region on silicon semiconductor substrate 101 as a first gate insulating film. After channel ion implantation is performed in a channel formation region under a floating gate being described later so as to control a threshold value, first polysilicon layer 103 serving as a floating gate is formed on $SiO_2$ film 102 in the channel formation region and is patterned in a prescribed shape. $SiO_2$ film 104 serving as a second gate insulating film is formed on polysilicon layer 103, and then second polysilicon layer 105 is deposited on the entire surface. The resultant structure is patterned by the known self-align etching method, thereby forming stacked gate structure 121, as shown in FIG. 2A.

Figure 2B:
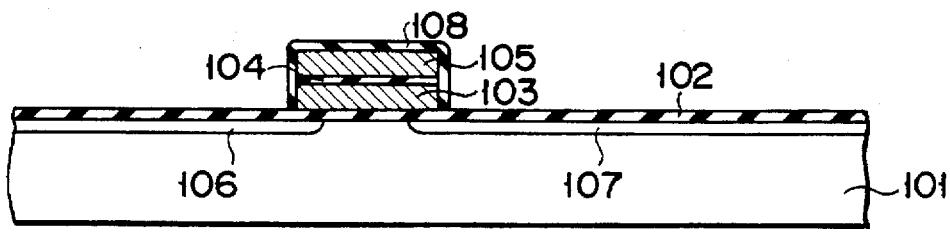

As shown in FIG. 2B, As ions are implanted into both sides of stacked gate structure 121 to form source and drain regions 106 and 107. Then, the entire surface is thermally oxidized to cover stacked gate structure 121 including first and second polysilicon layers 103 and 105 with $SiO_2$ film 108.

Figure 2C:
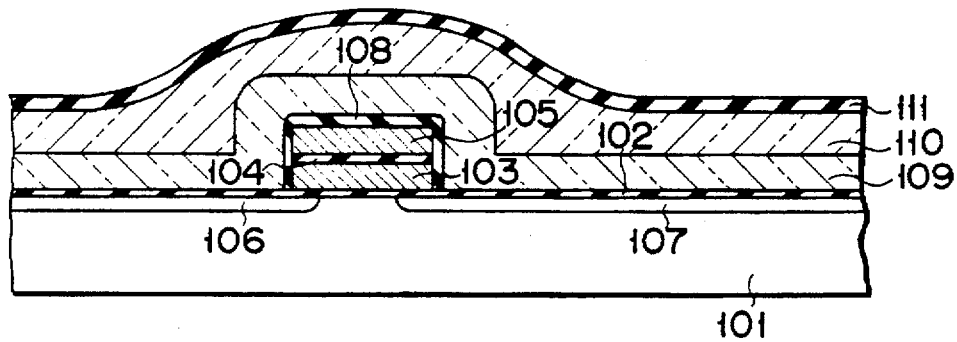

As shown in FIG. 2C, a glass film containing $1 \times 10^{20}$ cm$^{-3}$ to $3 \times 10^{21}$ cm$^{-3}$ of phosphorus, i.e., PSG film 109 is formed to a thickness of 5,000 Å on the entire surface. Then, a surface flattening material such as a glass film containing phosphorus, i.e., PSG film 110 is coated to a thickness of 5,000 Å on PSG film 109, and is heated to flatten PSG film 110. After molybdenum silicide 111 is deposited on PSG film 110 by sputtering, resist film 112 is coated on the entire surface.

Figure 2D:
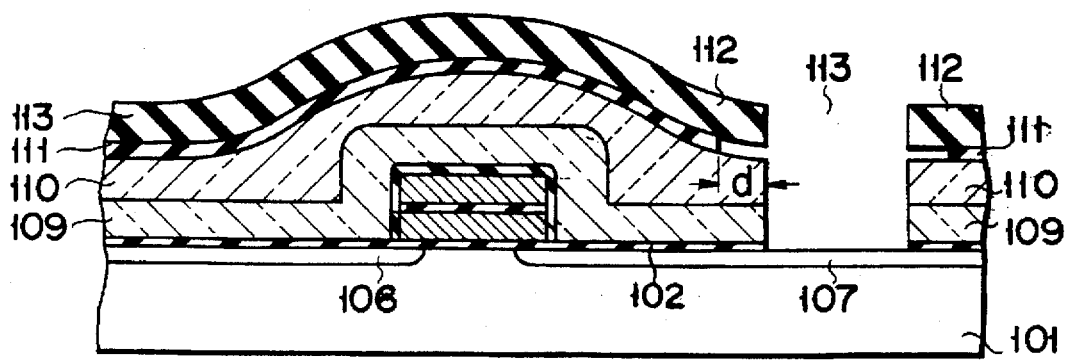

As shown in FIG. 2D, resist film 112 is left excepting the part on a contact formation portion. Then, dry etching is performed using remaining resist film 112 as a mask to sequentially etch molybdenum silicide film 111, PSG film 110, PSG film 109, and SiO$_2$ film 102 and form contact hole 113. In this etching process, molybdenum silicide film 111 is etched by isotropic etching, so that molybdenum silicide film 111 is side-etched by d from the contact pattern or a wall of contact hole 113, as shown in FIG. 2D.

Figure 2E:
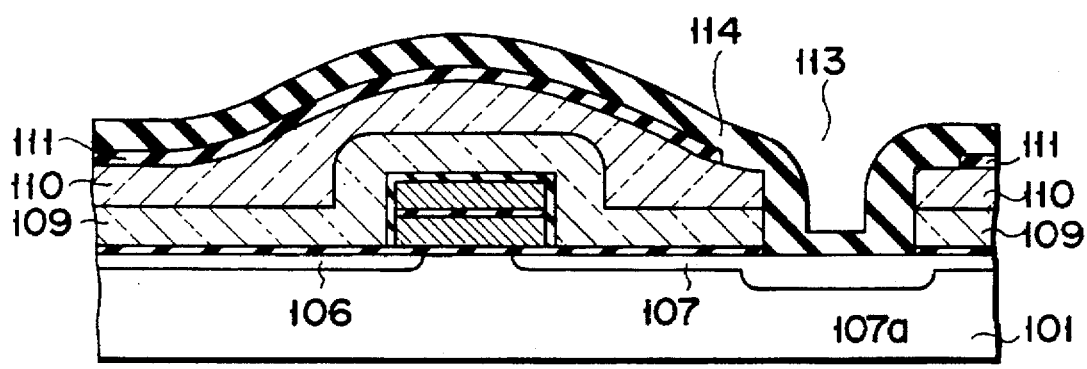

Resist film 112 is removed and the entire substrate is cleaned. Subsequently, as shown in FIG. 2E, 2,000 Å-thick PSG film 114 containing phosphorus is formed by the known low-pressure chemical vapour deposition (LPCVD) method. The resultant structure is annealed in an N$_2$ atmosphere at a temperature of 900° C. for 60 minutes. Upon annealing, phosphorus is diffused from PSG film 114 into substrate 101 under contact hole 113 to form deep junction 107a in drain region 107, as shown in FIG. 2E. If the concentration of phosphorus in PSG film 114 used in this case is small, a process of ion-implanting phosphorus into a surface of n$^+$-type diffusion layer formation region 107a is added after contact hole 113 is formed and before PSG film 114 is formed.

Figure 2F:
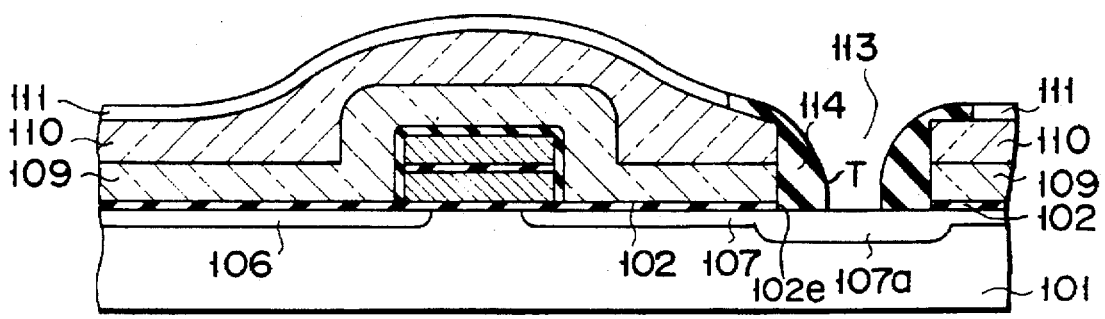

As shown in FIG. 2F, PSG film 114 is etched by anisotropic dry etching to remove only the part on the bottom portion of contact hole 113 and leave the other part on the side wall thereof. In this case, since PSG film 114 is left on the portion from which molybdenum silicide film 111 is side-etched, contact hole 113 is formed so as to have a tapered portion T, as shown in FIG. 2F. In this case, an end face 102e of SiO$_2$ film 102 is covered with PSG film 114, and hence Na$^+$ ions do not migrate from this portion.

Figure 2G:
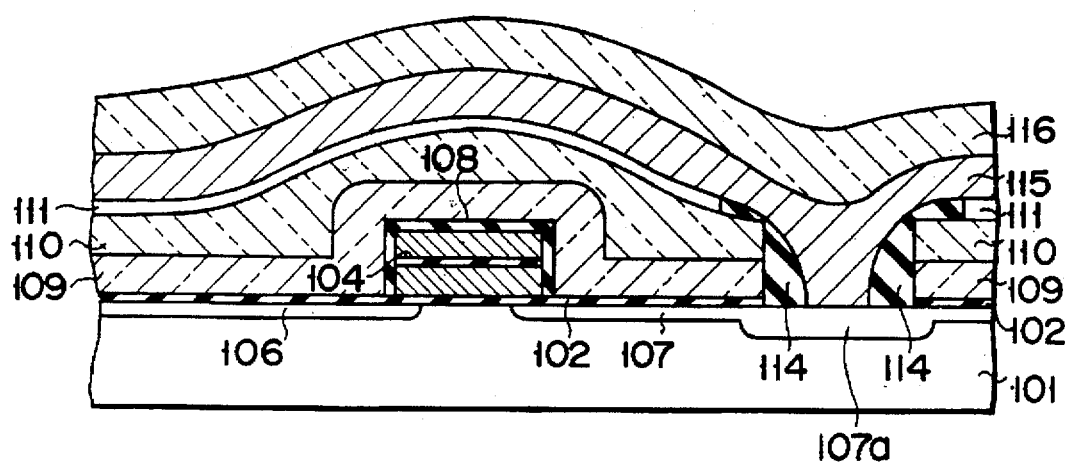

Upon cleaning of the resultant structure, as shown in FIG. 2G, Al wiring 115 is formed by a known method. In addition, PSG film 116 for coating is formed on Al wiring 115, thereby forming an EPROM cell. A wiring formed of a doped polysilicon layer may also be used.

With such a manufacturing method, Al wiring 115 in contact hole 113 is completely isolated from SiO$_2$ film 102 by PSG film 114. PSG film 114 does not allow the position free ions, such as Na$^+$ pass therethrough compared with SiO$_2$ film 102. Therefore, in the process of forming contact hole 113 and Al wiring 115, the migration of free ions such as Na$^+$ into the EPROM cell can be prevented, and a high-reliability EPROM can be obtained.

Furthermore, in the process shown in FIG. 2E, since the process of annealing is added upon formation of PSG film 114, the junction in contact portion 113 is changed from shallow junction 107 formed by As ions to deep junction 107a formed by phosphorus diffusion. Therefore, short circuiting from wiring 115 to substrate 101 by the deposite Al can be prevented.

In this annealing process, a large number of free ions such as Na$^+$ present in the periphery of the cell in the previous processes are taken into PSG films 109, 110, and 114. Therefore, the concentration of free ions in SiO$_2$ films 102, 104, and 108 can be decreased. The annealing process may be performed after PSG film 114 is etched in the process of FIG. 2F.

Uniformity in thickness of Al wiring 115 is improved by the tapered portion T of PSG film 114 formed in contact hole 113. In addition, since no step of wiring 115 is formed at the edge portion of contact hole 113, a breakage or the like in coating PSG film 116 at the contact portion can be prevented, and hence its coating property is improved. For this reason, not only the migration of free ions during the manufacturing process can be prevented, but also the number of free ions which externally migrate upon completion of the manufacturing process can be reduced.

Note that molybdenum silicide film 111 is used as a stopper material for etching PSG film 114, and another material may be used as a stopper. However, since this film is formed under Al wiring 115, it is preferably made of a metal or a semiconductor. If molybdenum silicide is used as in this embodiment, stress applied onto the Al wiring due to the difference between thermal expansion efficiencies of materials used can be reduced, and therefore the service life of the wiring can be prolonged.

Only the formation of the EPROM cell has been described above. However, the present invention is not limited to the EPROM cell. When the concept of the present invention is applied to the formation of an electrode leading portion of an MIS semiconductor device, it is very effective in prevention of the migration of free ions, and hence a high-reliability semiconductor device can be obtained.

Figure 3A:
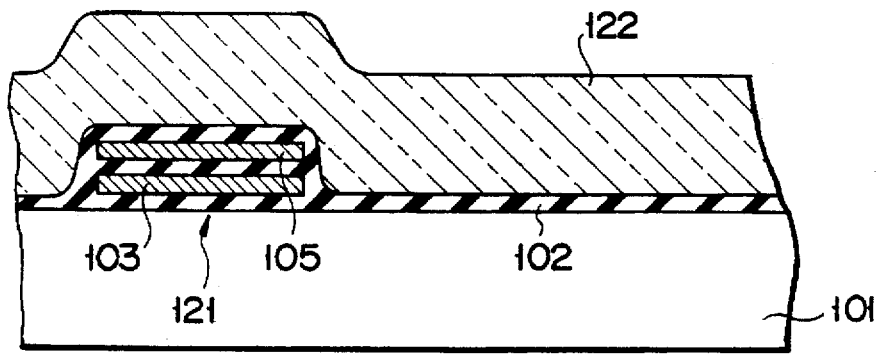
Figure 3B:
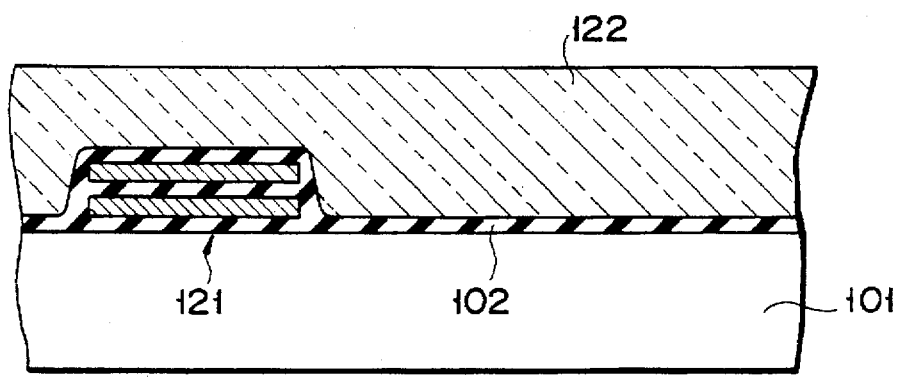

FIGS. 3A to 3E show another embodiment wherein a Si$_3$N$_4$ film is used to prevent the migration of free ions. Although stacked gate structure 121 is formed in the same manner as in FIG. 2A, it is covered with PSG film 122, as shown in FIG. 3A. For example, after post oxide (SiO$_2$) film 102 having a thickness of 600 Å is formed, PSG film 122 is deposited to a thickness of 6,000 Å. Then, as shown in FIG. 3B, the resultant structure is annealed at a high temperature for flattening its surface. At this time, free ions such as Na$^+$ taken in during the device process are gotten in PSG film 122. Contact hole 123 is formed in an insulating interlayer composed of PSG film 122 and post oxide film 102 by photolithography (FIG. 3C). Subsequently, as shown in FIG. 3D, in order to prevent the migration of Na$^+$, Si$_3$N$_4$ film 124 is deposited to a thickness of, e.g., 500 Å. If an impurity, e.g., phosphorus is required to be diffused again into contact 125, phosphorus may be ion-implanted prior to the deposition of the Si$_3$N$_4$ film 124. The resultant structure is annealed at a temperature of 900° C. for 30 minutes. In this process, free ions migrated from the formation of the contact hole 123 until the deposition of Si$_3$N$_4$ film 124 are gotten again in PSG film 122 (FIG. 3D). Then, Si$_3$N$_4$ film 124 on a bottom portion of the contact hole is removed by RIE (Reactive Ion Etching) to expose a surface of contact 125 on substrate 101 and leave Si$_3$N$_4$ film 124 on only a side wall (inner wall) of contact hole 123. Aluminum film 126 is deposited and patterned to complete a wiring layer having contact portion 123A (FIG. 3E).

According to the above embodiment, free ions Na$^+$ migrating upon formation of contact hole 123, especially upon formation of Al film 126 can be blocked by Si$_3$N$_4$ film 124. In addition, if Si$_3$N$_4$ film 124 is formed and the resultant structure is annealed once at a high temperature of 700° C. or more, free ions migrating to oxide film 102 from the time when contact hole 123 is opened until the time when Si$_3$N$_4$ film 124 is formed can be gotten in PSG film 122, thereby further enhancing the effect. Using Si$_3$N$_4$ film enables to apply the described process to a p$^+$ contact formation in the same time as the formation of N$^+$ contact.

According to a first characteristic of the embodiment shown in FIGS. 3A to 3E, a semiconductor device comprises a nonvolatile semiconductor memory cell formed on a semiconductor substrate, an insulating interlayer for covering the memory cell, a contact hole formed in the insulating interlayer, a metal wiring layer running through the contact hole, and a layer, formed between the metal wiring layer and an inner wall of the contact hole, for blocking positive free ions compared to an $SiO_2$ film. According to a second characteristic of the embodiment, a method for manufacturing a semiconductor device, comprises the steps of forming a nonvolatile semiconductor memory cell on a semiconductor substrate, forming an insulting interlayer to cover the memory cell, forming a contact hole in the insulating interlayer, forming a layer e.g., $Si_3N_4$ film in an inner wall of the contact hole, for blocking positive free ions compared to an $SiO_2$ film, forming a metal wiring layer running through the contact hole, and heating at a high temperature of 700° C. or more upon formation of the layer for blocking free ions and prior to the formation of the metal wiring layer. Accordingly, in the embodiment, in order to prevent the migration of free ions through the contact hole (positive free ions with respect to the $SiO_2$ film), the layer for blocking free ions is formed on the side wall (inner wall) of the contact hole. The layer aims at blocking free ions upon formation of the contact hole, especially those migrating when the metal wiring layer is formed. After the layer for blocking free ions is formed, if the resultant structure is heated at a high temperature of 700° C. or more, the free ions migrating from the time when the contact hole is formed until when the layer for blocking free ions is formed can be gotten in the insulating interlayer (e.g., a PSG film), thereby further enhancing the effect. For example, an $Si_3N_4$ film or PSG film can be used as the layer for blocking free ions.

As has been described above, according to the present invention, in a semiconductor device such as a nonvolatile semiconductor memory manufactured using the present invention, the amount of free ions migrating into a wafer during the process of forming a contact is small compared with that in the conventional technique, and a high-reliability device can be obtained.

What is claimed is:

1. A method for manufacturing a semiconductor device, comprising the steps of:
   forming a first insulating film in an element formation region on a semiconductor substrate;
   forming a stacked gate structure comprising a first gate serving as a floating gate on said first insulating film and a second gate isolated from said first gate by a second insulating film;
   forming a source region and a drain region:
   forming a third insulating film on an entire surface of said stacked gate structure;
   forming a free ion getter film on said first insulating film and on said third insulating film;
   etching said first insulating film and said free ion getter film to form a contact hole on said source region and on said drain region in which said semiconductor substrate is exposed;
   forming a free ion blocking film on a surface of said device including an inner wall surface of said contact hole, said free ion blocking film having a higher blocking characteristic of a free ion than that of said first insulating film;
   etching said free ion blocking film so as to leave said blocking film on a side wall of said contact hole; and
   forming a wiring in said contact hole.

2. The method according to claim 1, wherein the steps of forming said first insulating film, said second insulating film and said third insulating film include the steps of forming $SiO_2$ films.

3. The method according to claim 1, wherein the step of forming said free ion getter film includes the step of forming a first PSG film containing phosphorus of a density in the range from $1 \times 10^{20}$ $cm^{-3}$ to $3 \times 10^{21}$ $cm^{-3}$.

4. The method according to claim 3, wherein the step of forming said free ion getter film includes the step of forming a surface-flattening second PSG film on said first PSG film.

5. The method according to claim 4, wherein the step of forming said free ion blocking film includes the step of forming a stopper film on said second PSG film and the step of forming a tapered third PSG film portion on the side wall of said contact hole by isotropic etching of said stopper film.

6. A method according to claim 3, wherein before said contact hole is formed, a step of gettering using said free ion getter film including said first PSG film is performed.

7. The method according to claim 5, wherein the step of forming said stopper film includes the step of forming a molybdenum silicide film.

8. The method according to claim 1, further including, after at least one of the steps of forming said free ion getter film and of forming said free ion blocking film, the step of thermal annealing at a temperature higher than 700° C.

9. A method for manufacturing a semiconductor device, comprising the steps of:
   forming a first insulating film in an element formation region on a semiconductor substrate;
   forming a stacked gate structure comprising a first gate serving as a floating gate on said first insulating film and a second gate isolated from said first gate by a second insulating film;
   forming a source region and a drain region;
   forming a third insulating film on an entire surface of said stacked gate structure;
   forming a free ion getter film on said first insulating film and on said third insulating film;
   first thermal annealing said free ion getter film to flatten said free ion getter film and to getter free ions in said first insulating film, said second insulating film and said third insulating film;
   etching said first insulating film and said free ion getter film to form a contact hole on said source region and on said drain region in which said semiconductor substrate is exposed;
   forming a free ion blocking $Si_3N_4$ film on a surface of said device including an inner wall surface of said contact hole;
   second thermal annealing said free ion getter film to getter free ions migrating into said first insulating film, said second insulating film and said third insulating film in said step of forming said free ion blocking $Si_3N_4$ film;
   etching said free ion blocking $Si_3N_4$ film so as to leave said free ion blocking $Si_3N_4$ film on a side wall of said contact hole; and
   forming wiring in said contact hole.

10. The method according to claim 9, wherein the steps of forming said first insulating film, said second insulating film and said third insulating film include the steps of forming $SiO_2$ films.

11. The method according to claim 9, wherein at least one of said first and second thermal annealing steps includes the step of thermal annealing at a temperature higher than 700° C.

* * * * *